(12) United States Patent
Wu

(10) Patent No.: US 11,056,550 B2
(45) Date of Patent: Jul. 6, 2021

(54) DISPLAY PANEL, MANUFACTURING METHOD THEREOF, AND DISPLAY MODULE

(71) Applicant: WUHAN CHINA STAR OPTOELECTRONICS SEMICONDUCTOR DISPLAY TECHNOLOGY CO., LTD., Hubei (CN)

(72) Inventor: Junjie Wu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 45 days.

(21) Appl. No.: 16/325,409

(22) PCT Filed: Jan. 24, 2019

(86) PCT No.: PCT/CN2019/073013
§ 371 (c)(1),
(2) Date: Feb. 14, 2019

(87) PCT Pub. No.: WO2020/082636
PCT Pub. Date: Apr. 30, 2020

(65) Prior Publication Data
US 2020/0243631 A1    Jul. 30, 2020

(30) Foreign Application Priority Data

Oct. 23, 2018    (CN) .......................... 201811238975.2

(51) Int. Cl.
*H01L 27/32* (2006.01)
*H01L 51/50* (2006.01)
*H01L 51/52* (2006.01)

(52) U.S. Cl.
CPC ...... *H01L 27/3262* (2013.01); *H01L 27/3246* (2013.01); *H01L 51/5072* (2013.01); *H01L 51/5206* (2013.01); *H01L 51/5221* (2013.01)

(58) Field of Classification Search
CPC ............. H01L 27/3262; H01L 27/3246; H01L 51/5072; H01L 51/5206; H01L 51/5221;
(Continued)

(56) References Cited

U.S. PATENT DOCUMENTS 5,917,280 A * 6/1999 Burrows ............. H01L 27/3209
                                                    313/503
7,327,081 B2 * 2/2008 Lo ....................... H01L 27/3211
                                                    313/506
(Continued)

FOREIGN PATENT DOCUMENTS

CN        1215500 A     4/1999
CN       102201431 A    9/2011
(Continued)

*Primary Examiner* — Jonathan A Boyd
(74) *Attorney, Agent, or Firm* — Mark M. Friedman

(57) ABSTRACT

The present invention provides a display panel, a manufacturing method thereof, and a display module. The display panel includes a light emitting device. The light emitting device includes an anode electrode layer, a cathode electrode layer, and at least two light emitting layers, and at least one auxiliary electrode layer. The at least two light emitting layers are disposed between the anode electrode layer and the cathode electrode layer. Each auxiliary electrode layer is disposed between two adjacent light emitting layers. The at least one auxiliary electrode layer, the anode electrode layer, and the cathode electrode layer are separated from each other. The light emitting layers are separated from each other.

18 Claims, 3 Drawing Sheets

(58) Field of Classification Search
CPC ............... H01L 27/3209; H01L 27/326; H01L 27/3248; H01L 27/3244
See application file for complete search history.

(56) References Cited

U.S. PATENT DOCUMENTS

| | | | |
|---|---|---|---|
| 8,358,060 B2 | 1/2013 | Song et al. | |
| 2005/0264550 A1* | 12/2005 | Ohshima | G09G 3/3233 345/204 |
| 2006/0006792 A1* | 1/2006 | Strip | H01L 27/3209 313/500 |
| 2009/0009101 A1* | 1/2009 | Kang | H01L 27/3209 315/250 |
| 2009/0066617 A1* | 3/2009 | Chang | G09G 3/3233 345/83 |
| 2011/0233576 A1* | 9/2011 | Okutani | H01L 27/3216 257/89 |
| 2011/0248249 A1* | 10/2011 | Forrest | H01L 51/5036 257/40 |
| 2013/0200380 A1 | 8/2013 | Chang et al. | |
| 2015/0185528 A1* | 7/2015 | Xun | G02F 1/1333 349/62 |
| 2019/0172876 A1* | 6/2019 | Xia | H01L 51/5206 |

FOREIGN PATENT DOCUMENTS

| | | |
|---|---|---|
| CN | 103247656 A | 8/2013 |
| CN | 107808897 A | 3/2018 |
| CN | 108550612 A | 9/2018 |

* cited by examiner

DISPLAY PANEL, MANUFACTURING METHOD THEREOF, AND DISPLAY MODULE

FIELD OF DISCLOSURE

The present invention relates to a field of display devices and in particular, to a display panel, a manufacturing method thereof, and a display module.

DESCRIPTION OF RELATED ART

In flat panel display technology, an organic light emitting diode (OLED) display has many advantages, such as being light and thin, active illumination, fast responses, wide viewing angles, a wide color range, high brightness, and low power consumption, so the OLED display is considered to be the third generation display technology after liquid crystal displays (LCDs). Compared with the LCDs, an OLED has the advantages of more power saving, being thinner, and wider viewing angles, which are unmatched by the LCDs. At present, people are increasingly demanding display quality, that is, the resolution, but there are still many challenges in manufacturing high-quality, high-resolution OLED displays.

Currently, OLED screens in a display field usually use a structure in which R, G, and B pixel units are arranged flat, and RGB light-emitting units are produced by evaporating materials to corresponding positions by using a fine metal mask (FMM) having an opening for a precise pixel position alignment, so that different pixels emit light of different colors. However, this structure has extremely high requirements on the FMM, and especially in a process of manufacturing a large-sized panel, it is particularly difficult to produce the RGB light-emitting units by using the FMM to perform accurate evaporation. Therefore, there is a need to provide a display panel, a manufacturing method thereof, and a display module to solve the problem.

SUMMARY

The present invention provides a display panel, a manufacturing method thereof, and a display module, so as to solve the problem that a conventional display panel needs a fine metal mask (FMM) for accurate alignment during manufacturing of a light emitting layer. Utilization of the FMM causes difficulty in a manufacturing process, and also leads to higher production costs.

In solution, the present invention provides a display panel. The display panel comprises a substrate and a pixel unit disposed on a surface of the substrate, the pixel unit comprising:

a thin film transistor (TFT) array disposed on the substrate, the TFT array comprising a plurality of TFTs arranged in an array;

a planarization layer disposed on the TFT array;

a pixel defining layer disposed on the planarization layer, the pixel defining layer comprising a plurality of pixel defining bodies disposed spaced apart from each other; and a light emitting device disposed in an area between the pixel defining bodies, the light emitting device comprising:

an anode electrode layer disposed on the planarization layer;

a cathode electrode layer disposed over the anode electrode layer;

at least two light emitting layers disposed between the anode electrode layer and the cathode electrode layer; and at least one auxiliary electrode layer, each auxiliary electrode layer being disposed between two adjacent ones of the light emitting layers;

wherein the at least one auxiliary electrode layer, the anode electrode layer, and the cathode electrode layer are separated from each other, and the at least two light emitting layers are separated from each other.

According to one embodiment of the present invention, the light emitting device comprises a first light emitting layer, a second light emitting layer, a third light emitting layer, a first auxiliary electrode layer, and a second auxiliary electrode layer. The first light emitting layer is disposed on the anode electrode layer. The first auxiliary electrode layer is disposed on the first light emitting layer. The second light emitting layer is disposed on the first auxiliary electrode layer. The second auxiliary electrode layer is disposed on the second light emitting layer. The third light emitting layer is disposed on the second auxiliary electrode layer. The cathode electrode layer is disposed on the third light emitting layer.

According to one embodiment of the present invention, each of the first light emitting layer, the second light emitting layer, and the third light emitting layer is one of a red light emitting layer, a green light emitting layer, and a blue light emitting layer. The first light emitting layer, the second light emitting layer, and the third light emitting layer emit light of different colors.

According to one embodiment of the present invention, the TFT array is electrically connected to the anode electrode layer and the at least one auxiliary electrode layer through different through holes.

According to one embodiment of the present invention, the at least one auxiliary electrode layer and the anode electrode layer are electrically connected to different ones of the TFTs.

According to one embodiment of the present invention, the display panel comprises the first auxiliary electrode layer, the second auxiliary electrode layer, a first TFT, a second TFT, and a third TFT. The anode electrode layer is electrically connected to the first TFT, the first auxiliary electrode layer is electrically connected to the second TFT, and the second auxiliary electrode layer is electrically connected to the third TFT.

According to one embodiment of the present invention, the through holes comprise a first through hole, a second through hole, and a third through hole. The anode electrode layer is electrically connected to the first TFT through the first through hole, the first auxiliary electrode layer is electrically connected to the second TFT through the second through hole, and the second auxiliary electrode layer is electrically connected to the third TFT through the third through hole.

According to one embodiment of the present invention, the TFT array comprises an active layer, a first gate insulating layer, a first metal layer, a second gate insulating layer, a second metal layer, an interlayer insulating layer, and a third metal layer sequentially stacked on each other. The third metal layer is connected to the active layer through the through hole. The first through hole penetrates the planarization layer. The second through hole and the third through hole penetrate the pixel defining layer and the planarization layer for connecting the third metal layer of the TFT array to the light emitting device.

According to one embodiment of the present invention, each of the light emitting layers comprises a hole transport layer, a light emitting device layer, and an electron transport layer.

The present invention provides a manufacturing method of a display panel according to another aspect of the present invention. The manufacturing method comprises steps as follows:

step S10: providing a substrate, and forming a thin film transistor (TFT) array on the substrate, wherein the TFT array comprises a plurality of TFTs arranged in an array;

step S20: forming a planarization layer on the TFT array and forming a pixel defining layer on the planarization layer, wherein the pixel defining layer comprises a plurality of pixel defining bodies disposed spaced apart from each other; and step S30: forming an anode electrode layer, a first light emitting layer, a first auxiliary electrode layer, a second light emitting layer, a second auxiliary electrode layer, a third light emitting layer, and a cathode electrode layer in a gap between the pixel defining bodies;

wherein the TFT array comprises a first TFT, a second TFT, and a third TFT, the anode electrode layer, the first auxiliary electrode layer, and the second auxiliary electrode layer are electrically connected to different TFTs through different through holes.

According to one embodiment of the present invention, the TFT comprises a planarization layer. Step S30 comprises:

step S301: forming a first through hole in the pixel defining layer and the planarization layer and forming an anode electrode layer between the pixel defining bodies, wherein the anode electrode layer is electrically connected to a metal layer of the first TFT;

step S302: forming a first light emitting layer on the anode electrode layer, forming a second through hole in the pixel defining layer and the planarization layer, and forming a first auxiliary electrode layer by using a fine metal mask plate, wherein the first auxiliary electrode layer is electrically connected to the second TFT through the second through hole;

step S303: forming a second light emitting layer on the first auxiliary electrode layer, forming a third through hole in the pixel defining layer and the planarization layer, and forming a second auxiliary electrode layer by using the fine metal mask plate, wherein the second auxiliary electrode layer is electrically connected to the third TFT through the third through hole; and step S303: sequentially forming a third light emitting layer and an anode electrode layer on the second auxiliary electrode layer;

wherein the through holes comprise the first through hole, the second through hole, and the third through hole, the first through hole is formed using a photomask process, and the second through hole and the third through hole are formed using a laser etching process.

According to still another aspect of the present invention, a display module is provided. The display module comprises a display panel and comprises a polarizing layer and a cover plate disposed on the display panel; the display panel comprises a substrate and a pixel unit disposed on the substrate; and the pixel unit comprises:

a thin film transistor (TFT) array disposed on the substrate, the TFT array comprises a plurality of TFTs arranged in an array;

a planarization layer disposed on the TFT array;

a pixel defining layer disposed on the planarization layer, the pixel defining layer comprising a plurality of pixel defining bodies spaced apart from each other; and a light emitting device disposed in an area between the pixel defining bodies, the light emitting device comprising:

an anode electrode layer disposed on the planarization layer;

a cathode electrode layer disposed over the anode electrode layer;

at least two light emitting layers disposed between the anode electrode layer and the cathode electrode layer; and at least one auxiliary electrode layer, each auxiliary electrode layer being disposed between two adjacent ones of the light emitting layers;

wherein the at least one auxiliary electrode layer, the anode electrode layer, and the cathode electrode layer are separated from each other; and the light emitting layers are separated from each other.

According to one embodiment of the present invention, the light emitting device comprises a first light emitting layer, a second light emitting layer, a third light emitting layer, a first auxiliary electrode layer, and a second auxiliary electrode layer, wherein the first light emitting layer is disposed on the anode electrode layer, the first auxiliary electrode layer is disposed on the first light emitting layer, the second light emitting layer is disposed on the first auxiliary electrode layer, the second auxiliary electrode layer is disposed on the second light emitting layer, the third light emitting layer is disposed on the second auxiliary electrode layer, and the cathode electrode layer is disposed on the third light emitting layer.

According to one embodiment of the present invention, each of the first light emitting layer, the second light emitting layer, and the third light emitting layer is one of a red light emitting layer, a green light emitting layer, and a blue light emitting layer, and the first light emitting layer, the second light emitting layer, and the third light emitting layer emit light of different colors.

According to one embodiment of the present invention, the TFT array is electrically connected to the anode electrode layer and the at least one auxiliary electrode layer through different through holes.

According to one embodiment of the present invention, the at least one auxiliary electrode layer and the anode electrode layer are electrically connected to different ones of the TFTs.

According to one embodiment of the present invention, the display panel comprises the first auxiliary electrode layer, the second auxiliary electrode layer, a first TFT, a second TFT, and a third TFT, the anode electrode layer is electrically connected to the first TFT, the first auxiliary electrode layer is electrically connected to the second TFT, and the second auxiliary electrode layer is electrically connected to the third TFT.

According to one embodiment of the present invention, the through holes comprise a first through hole, a second through hole, and a third through hole. The anode electrode layer is electrically connected to the first TFT through the first through hole, the first auxiliary electrode layer is electrically connected to the second TFT through the second through hole, and the second auxiliary electrode layer is electrically connected to the third TFT through the third through hole.

According to one embodiment of the present invention, the TFT array comprises an active layer, a first gate insulating layer, a first metal layer, a second gate insulating layer, a second metal layer, an interlayer insulating layer, and a third metal layer sequentially stacked on each other. The third metal layer is connected to the active layer through the through hole. The first through hole penetrates the planarization layer. The second through hole and the third through hole penetrate the pixel defining layer and the planarization layer for connecting the third metal layer of the TFT array to the light emitting device.

According to one embodiment of the present invention, the light emitting layer comprises a hole transport layer, a light emitting device layer, and an electron transport layer.

Advantageous effects: The present application adopts a structure having the auxiliary electrode and the stacked light emitting layers in the display panel, thereby eliminating the need for a fine metal mask plate in manufacturing of the light emitting device. Therefore, the manufacturing method of the display panel is simplified, a single pixel can emit light of all colors, and the resolution of the display panel is also improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Embodiments of the present disclosure are described in detail with reference to the accompanying drawings as follows. Directional terms such as up/down, right/left and the like may be used for the purpose of enhancing a reader's understanding about the accompanying drawings, but are not intended to be limiting. Specifically, the terminologies in the embodiments of the present disclosure are merely for the purpose of describing certain embodiments, but not intended to limit the scope of the invention. The same reference numbers are used throughout the drawings to refer to the same or similar parts.

Figure 1:
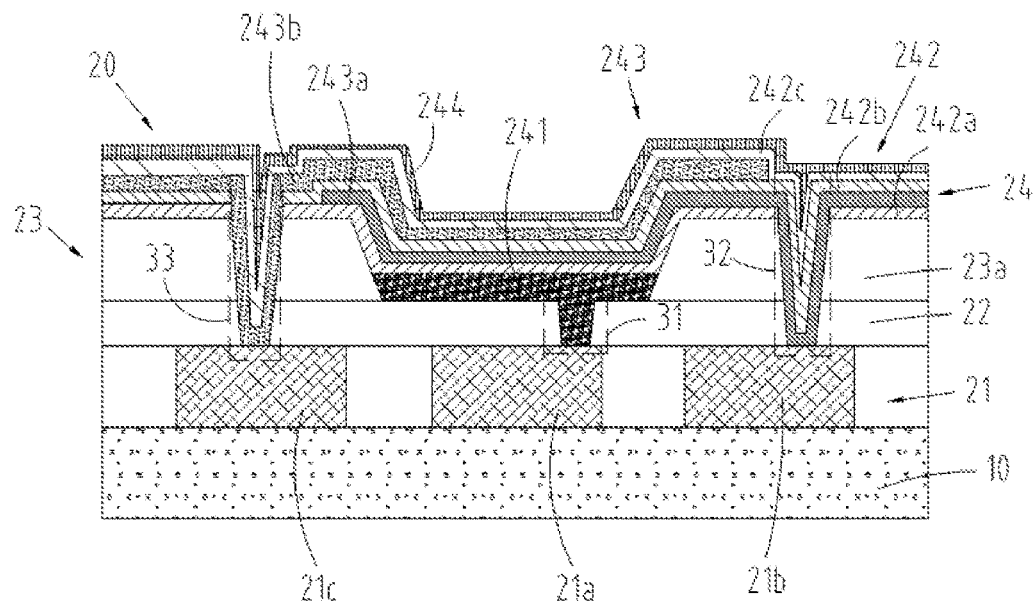
FIG. 1 is a schematic structural view illustrating a display panel according to one embodiment of the present invention.

Please refer to FIG. 1. FIG. 1 is a schematic structural view illustrating a display panel according to one embodiment of the present invention.

The present invention provides a display panel. The display panel comprises a substrate 10 and a pixel unit 20 disposed on a surface of the substrate 10. The pixel unit 20 comprises a thin film transistor (TFT) array 21, a planarization layer 22, a pixel defining layer 23, and a light emitting device 24.

The TFT array 21 is disposed on the substrate 10. The TFT array comprises a plurality of TFTs arranged in an array.

Figure 2:
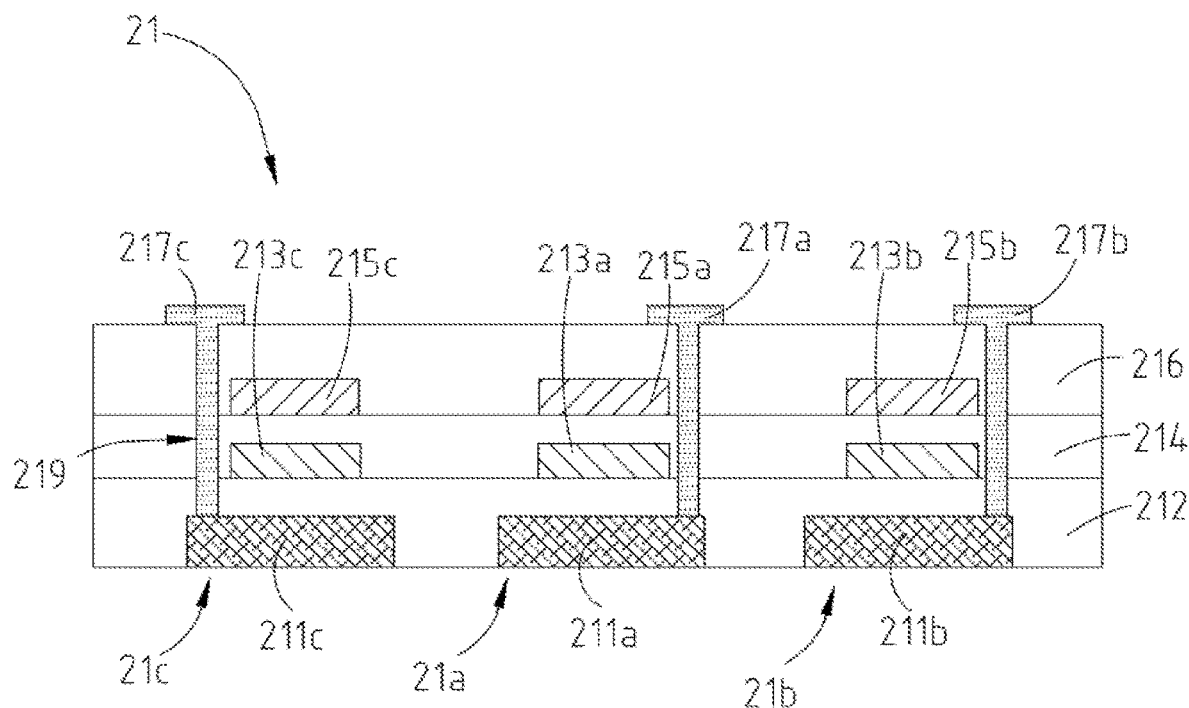
FIG. 2 is a schematic structural view illustrating a thin film transistor array of the display panel according to one embodiment of the present invention.

Please refer to FIG. 2, which is a schematic structural view illustrating the TFT array in the display panel according to one embodiment of the present invention.

The TFT array 21 comprises a first TFT 21a, a second TFT 21b, and a third TFT 21c. The three kinds of TFTs configured to provide different functions, which will be detailed hereinafter.

The planarization layer 22 is disposed on the TFT array 21 and is used for planarizing a surface of the TFT array 21.

The pixel defining layer 23 is disposed on the planarization layer 22. The pixel defining layer 23 comprises a plurality of pixel defining bodies 23a disposed spaced apart from each other. A pixel region is defined between the pixel defining bodies 23a.

The light emitting device 24 is disposed in an area between the pixel defining bodies 23a and is disposed on a surface of the planarization layer 22. The light emitting device 24 comprises an anode electrode layer 241, a cathode electrode layer, at least two light emitting layers 242, and at least one auxiliary electrode layer 243.

The anode electrode layer 241 is disposed on the planarization layer 22. The anode electrode layer 241 is electrically connected to the first TFT 21a through a first through hole 31, so as to receive a voltage signal sent from the first TFT 21a.

The cathode electrode layer 244 is disposed over the anode electrode layer 241.

The at least two light emitting layers 242 are disposed between the anode electrode layer 241 and the cathode electrode layer 242.

At least one auxiliary electrode layer 243 is provided, and each auxiliary electrode layer 243 is disposed between two adjacent ones of the at least two light emitting layers 242.

The at least one auxiliary electrode layer 243, the anode electrode layer 241, and the cathode electrode layer 242 are separated from each other, and the at least two light emitting layers 242 are separated from each other, thereby avoiding mutual influences between different light emitting layers.

According to one embodiment of the present invention, the light emitting device 24 comprises a first light emitting layer 242a, a second light emitting layer 242, a third light emitting layer 242c, a first auxiliary electrode layer 243a, and a second auxiliary electrode layer 243b.

According to one embodiment of the present invention, the first light emitting layer 242a is disposed on the anode electrode layer 241.

The first auxiliary electrode layer 243a is disposed on the first light emitting layer 242a.

The second light emitting layer 242b is disposed on the first auxiliary electrode layer 243a.

The second auxiliary electrode layer 243b is disposed on the second light emitting layer 242b.

The third light emitting layer 242c is disposed on the second auxiliary electrode layer 243b.

The cathode electrode layer 244 is disposed on the third light emitting layer 242c.

According to one embodiment of the present invention, each of the first light emitting layer 242a, the second light emitting layer 242b, and the third light emitting layer 242c is one of a red light emitting layer, a green light emitting layer, and a blue light emitting layer. The first light emitting layer 242a, the second light emitting layer 242b, and the third light emitting layer 242c emit light of different colors.

Furthermore, each of the light emitting layers 242 comprises a hole transport layer, a light emitting device layer, and an electron transport layer. The first light emitting layer 242a, the second light emitting layer 242b, and the third light emitting layer 242c all include the above-mentioned film layer structure.

It is preferable that the TFT array 21 is electrically connected to the anode electrode layer 241 and the at least one auxiliary electrode layer 243 through different through holes (comprising a first through hole 31, a second through hole 32, and a third through hole 33).

The at least one auxiliary electrode layer 243 and the anode electrode layer 241 are electrically connected to different ones of the TFTs.

The display panel preferably comprises a first auxiliary electrode layer 243a, a second auxiliary electrode layer 243b, a first TFT 21a, a second TFT 21b, and a third TFT 21c. The anode electrode layer 241 is electrically connected to the first TFT 21a. The first auxiliary electrode layer 243a is electrically connected to the second TFT 21b, and the second auxiliary electrode layer 243b is electrically connected to the third TFT 21c.

The through hole comprises the first through hole 31, the second through hole 32, and the third through hole 33.

The anode electrode layer 241 is electrically connected to the first TFT 21a through the first through hole 31, the first auxiliary electrode layer 243a is electrically connected to the second TFT 21b through the second through hole 32, and the second auxiliary electrode layer 243b is electrically connected to the third TFT 21c through the third through hole 33.

In detail, the TFT array 21 comprises an active layer, a first gate insulating layer 212, a first metal layer, a second gate insulating layer 214, a second metal layer, an interlayer insulating layer 216, and a third metal layer sequentially stacked on each other. The third metal layer is connected to the active layer through a via hole 219. In other words, the third metal layer passes through the interlayer insulation layer 216, the second gate insulation layer 214, and the first gate insulation layer 212 to connected to the active layer through the via hole 219.

In detail, the active layer comprises an active layer 211a of the first TFT 21a, an active layer 211b of the second TFT 21b, and an active layer 211c of the third TFT 21c. The first metal layer comprises a first metal layer 213a of the first TFT 21a, a first metal layer 213b of the second TFT 21b, a first metal layer 213c of the third TFT 21c. The second metal layer comprises a second metal layer 215a of the first TFT 21a, a second metal layer 215b of the second TFT 21b, and a second metal layer 215c of the third TFT 21c. The third metal layer comprises a third metal layer 217a of the first TFT 21a, a third metal layer 217b of the second TFT 21b, and a third metal layer 217c of the third TFT 21c.

The first through hole 31 penetrates a planarization layer 32. The second through hole 32 and the third through hole 33 penetrate the pixel defining layer 23 and the planarization layer 22 for connecting the third metal layer of the TFT array 21 to the light emitting device 24.

Figure 3:
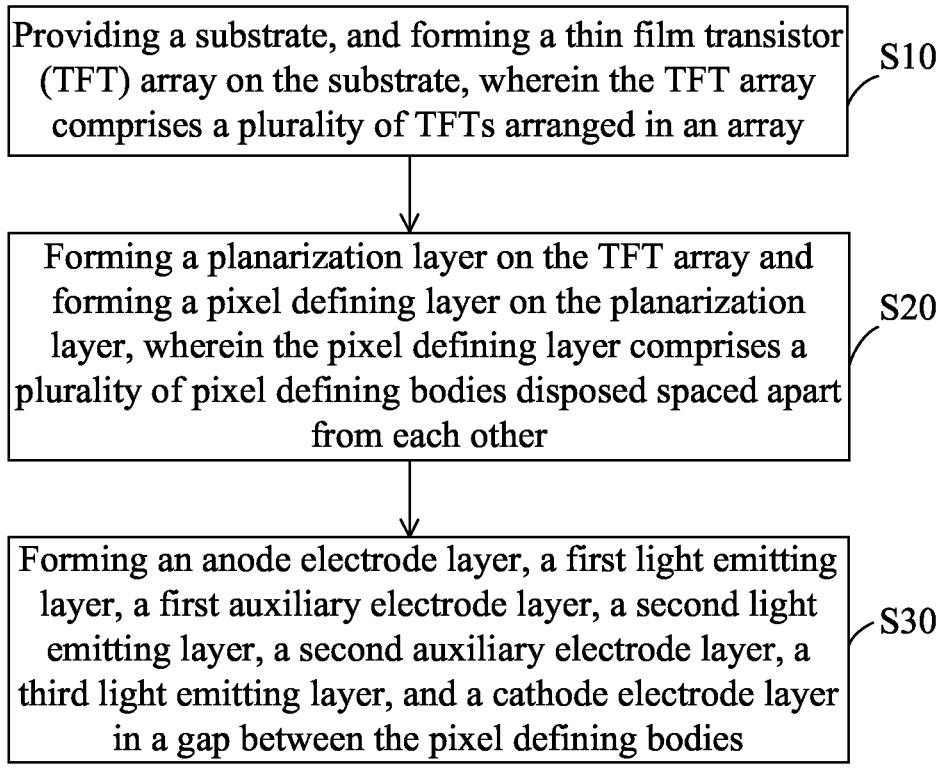
FIG. 3 is a process flow diagram illustrating a manufacturing method of a display panel according to another embodiment of the present invention.
Figure 4A:
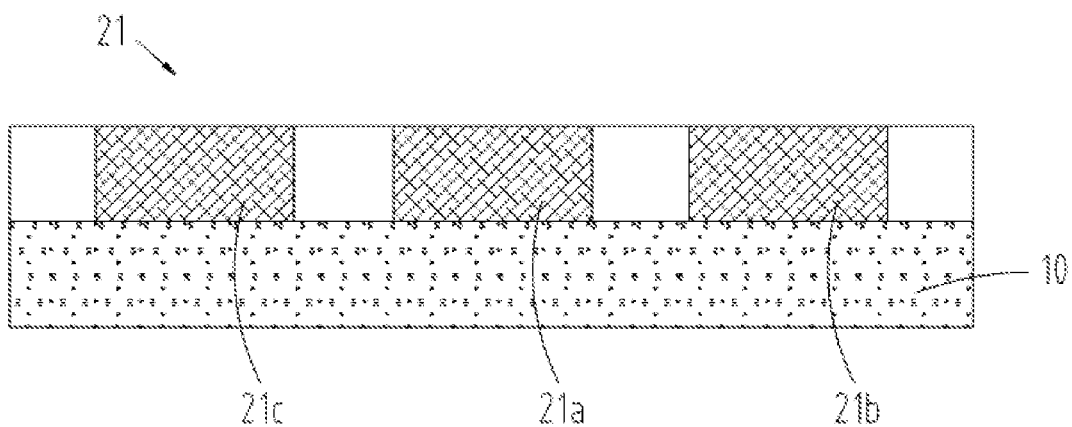
FIGS. 4A to 4C are process flow views illustrating a manufacturing method of a display panel according to another embodiment of the present invention.

Please refer to FIG. 3, illustrating a manufacturing method of a display panel according to another embodiment of the present invention. The manufacturing method comprises:

As shown in FIG. 4A, step S10: providing a substrate 10, and forming a thin film transistor (TFT) array 21 on the substrate 10, wherein the TFT array 21 comprises a plurality of TFTs arranged in an array.

Figure 4B:
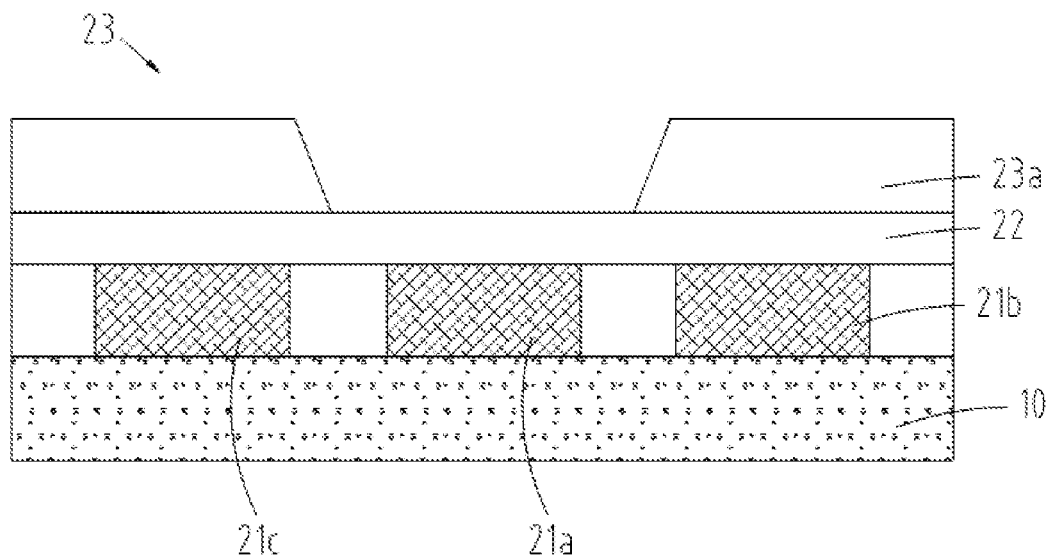

As shown in FIG. 4B, step S20: forming a planarization layer 22 on the TFT array 21 and forming a pixel defining layer 23 on the planarization layer 22, wherein the pixel defining layer 23 comprises a plurality of pixel defining bodies 23a disposed spaced apart from each other.

Figure 4C:
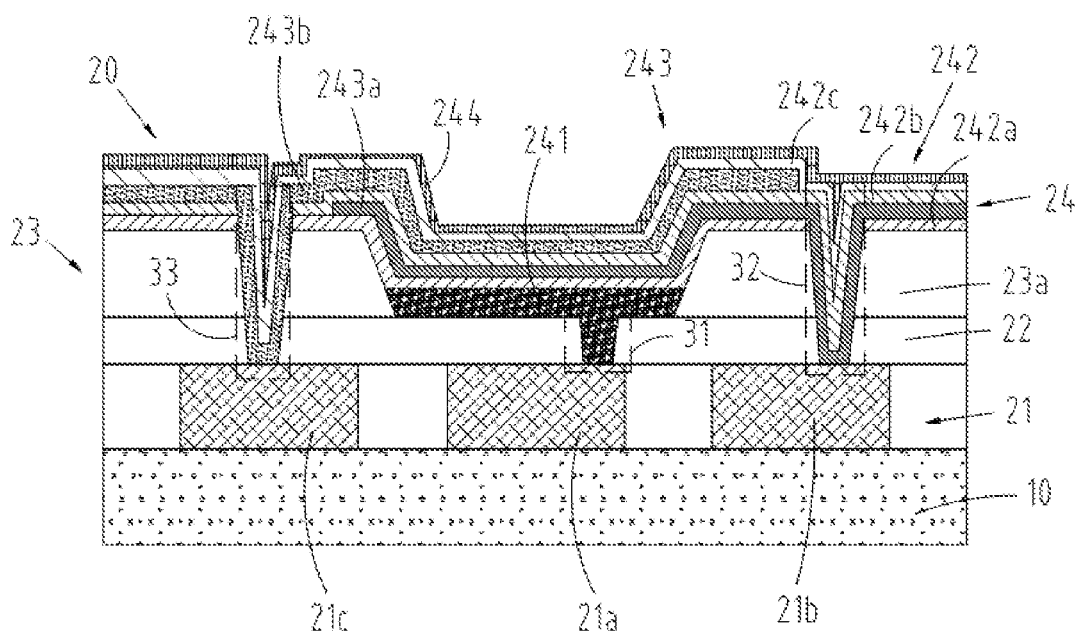

As shown in FIG. 4C, step S30: forming an anode electrode layer 241, a first light emitting layer 242a, a first auxiliary electrode layer 243a, a second light emitting layer 242b, a second auxiliary electrode layer 243b, a third light emitting layer 242c, and a cathode electrode layer 244 in a gap between the pixel defining bodies 23a.

According to one embodiment of the present invention, the TFT array 21 comprises a first TFT 21a, a second TFT 21b, and a third TFT 21c. The anode electrode layer 241, the first auxiliary electrode layer 243a, and the second auxiliary electrode layer 243b are electrically connected to different TFTs through different through holes.

According to one embodiment, step S30 comprises:

Step S301: forming a first through hole 31 in the pixel defining layer 23 and the planarization layer 22 and forming the anode electrode layer 241 between the pixel defining bodies 23a, wherein the anode electrode layer 241 is electrically connected to a metal layer of the first TFT 21a.

Step S302: forming the first light emitting layer 242a on the anode electrode layer 241, forming a second through hole 32 in the pixel defining layer 23 and the planarization layer 22, and forming the first auxiliary electrode layer 243a by using a fine metal mask plate, wherein the first auxiliary electrode layer 243a is electrically connected to the second TFT 21b through the second through hole 32.

Step S303: forming the second light emitting layer 242b on the first auxiliary electrode layer 243a, forming a third through hole 33 in the pixel defining layer 23 and the planarization layer 22, and forming the second auxiliary electrode layer 243b by using the fine metal mask plate, wherein the second auxiliary electrode layer 243b is electrically connected to the third TFT 21c through the third through hole 33.

Step S303: sequentially forming the third light emitting layer 242c and the anode electrode layer 244 on the second auxiliary electrode layer 243b.

The through holes comprises the first through hole 31, the second through hole 32, and the third through hole 33. The first through hole 31 is formed using a photomask process. The second through hole 32 and the third through hole 33 are formed using a laser etching process.

According to one embodiment of the present invention, the fine metal mask plate is used to define a boundary of the auxiliary electrode layer 243. The boundary comprises a pixel region and a through hole region.

In the pixel region of the display panel, a voltage drop between the anode electrode layer 241 and the first auxiliary electrode layer 243a determines brightness of the first light emitting layer 242a, a voltage drop between the first auxiliary electrode layer 243a and the second auxiliary electrode layer 243b determines brightness of the second light emitting layer 242b, and a voltage between the second auxiliary electrode layer 243b and the cathode layer 244 determines brightness of the third light emitting layer 242c. The present invention controls the voltages of the anode layer 241, the first auxiliary electrode layer 243a, and the second auxiliary electrode layer 243b through the TFT array 21, thereby realizing brightness adjustment of RGB three colors and OLED full color illumination. While improving the resolution of the display panel, the present invention also saves the trouble of making a precise alignment between the fine metal mask plate and a pixel, and the production efficiency of the display panel is thus improved.

The present application adopts the structure of the auxiliary electrode and the stacked light emitting layers in the display panel, so that the fine metal mask plate is not required for manufacturing the light emitting device. Therefore, the manufacturing process of the display panel is simplified, and a single pixel can emit light of all colors, and the resolution of the display panel is improved.

It is to be understood that the above descriptions are merely the preferable embodiments of the present invention and are not intended to limit the scope of the present invention. Equivalent changes and modifications made in the spirit of the present invention are regarded as falling within the scope of the present invention.

What is claimed is:

1. A display panel, comprising a substrate and a pixel unit disposed on a surface of the substrate, the pixel unit comprising:
   a thin film transistor (TFT) array disposed on the substrate, the TFT array comprising a plurality of TFTs arranged in an array, an active layer, a first gate insulating layer, a first metal layer, a second gate insulating layer, a second metal layer, an interlayer insulating layer, and a third metal layer sequentially stacked on each other, wherein the third metal layer is connected to the active layer through a via hole;
   a planarization layer disposed on the TFT array;
   a pixel defining layer disposed on the planarization layer, the pixel defining layer comprising a plurality of pixel defining bodies disposed spaced apart from each other; and
   a light emitting device disposed in an area between the pixel defining bodies, the light emitting device comprising:
   an anode electrode layer disposed on the planarization layer;
   a cathode electrode layer disposed over the anode electrode layer;
   at least two light emitting layers disposed between the anode electrode layer and the cathode electrode layer; and
   at least one auxiliary electrode layer, the each auxiliary electrode layer being disposed between two adjacent ones of the light emitting layers;
   wherein the at least one auxiliary electrode layer, the anode electrode layer, and the cathode electrode layer are separated from each other, and the at least two light emitting layers are separated from each other, a first through hole penetrates the planarization layer, and a second through hole and a third through hole penetrate the pixel defining layer and the planarization layer for connecting the third metal layer of the TFT array to the light emitting device.

2. The display panel according to claim 1, wherein the light emitting device comprises a first light emitting layer, a second light emitting layer, a third light emitting layer, a first auxiliary electrode layer, and a second auxiliary electrode layer, and wherein the first light emitting layer is disposed on the anode electrode layer, the first auxiliary electrode layer is disposed on the first light emitting layer, the second light emitting layer is disposed on the first auxiliary electrode layer, the second auxiliary electrode layer is disposed on the second light emitting layer, the third light emitting layer is disposed on the second auxiliary electrode layer, and the cathode electrode layer is disposed on the third light emitting layer.

3. The display panel according to claim 2, wherein each of the first light emitting layer, the second light emitting layer, and the third light emitting layer is one of a red light emitting layer, a green light emitting layer, and a blue light emitting layer; and the first light emitting layer, the second light emitting layer, and the third light emitting layer emit light of different colors.

4. The display panel according to claim 1, wherein the TFT array is electrically connected to the anode electrode layer and the at least one auxiliary electrode layer through different through holes.

5. The display panel according to claim 4, wherein the at least one auxiliary electrode layer and the anode electrode layer are electrically connected to different ones of the TFTs.

6. The display panel according to claim 5, wherein the display panel comprises the first auxiliary electrode layer, the second auxiliary electrode layer, a first TFT, a second TFT, and a third TFT; the anode electrode layer is electrically connected to the first TFT; the first auxiliary electrode layer is electrically connected to the second TFT; and the second auxiliary electrode layer is electrically connected to the third TFT.

7. The display panel according to claim 6, wherein the anode electrode layer is electrically connected to the first TFT through the first through hole; the first auxiliary electrode layer is electrically connected to the second TFT through the second through hole; and the second auxiliary electrode layer is electrically connected to the third TFT through the third through hole.

8. The display panel according to claim 1, wherein each of the light emitting layers comprises a hole transport layer, a light emitting device layer, and an electron transport layer.

9. The display panel according to claim 1, wherein the third metal layer passes through the interlayer insulation layer, the second gate insulation layer, and the first gate insulation layer to connect to the active layer through the via hole.

10. A display module, wherein the display module comprises a display panel and comprises a polarizing layer and a cover plate disposed on the display panel; the display panel comprises a substrate and a pixel unit disposed on the substrate; and the pixel unit comprises:
    a thin film transistor (TFT) array disposed on the substrate, the TFT array comprises a plurality of TFTs arranged in an array, an active layer, an active layer, a first gate insulating layer, a first metal layer, a second gate insulating layer, a second metal layer, an interlayer insulating layer, and a third metal layer sequentially stacked on each other, wherein the third metal layer is connected to the active layer through a via hole;
    a planarization layer disposed on the TFT array;
    a pixel defining layer disposed on the planarization layer, the pixel defining layer comprising a plurality of pixel defining bodies spaced apart from each other; and
    a light emitting device disposed in an area between the pixel defining bodies, the light emitting device comprising:
    an anode electrode layer disposed on the planarization layer;
    a cathode electrode layer disposed over the anode electrode layer;
    at least two light emitting layers disposed between the anode electrode layer and the cathode electrode layer; and
    at least one auxiliary electrode layer, each auxiliary electrode layer being disposed between two adjacent ones of the light emitting layers;
    wherein the at least one auxiliary electrode layer, the anode electrode layer, and the cathode electrode layer are separated from each other; and the light emitting layers are separated from each other, a first through hole penetrates the planarization layer, and a second through hole and a third through hole penetrate the pixel defining layer and the planarization layer for connecting the third metal layer of the TFT array to the light emitting device.

11. The display module according to claim 10, wherein the light emitting device comprises a first light emitting layer, a second light emitting layer, a third light emitting layer, a first auxiliary electrode layer, and a second auxiliary electrode layer, wherein the first light emitting layer is disposed on the anode electrode layer; the first auxiliary electrode layer is disposed on the first light emitting layer; the second light emitting layer is disposed on the first auxiliary electrode layer; the second auxiliary electrode layer is disposed on the second light emitting layer; the third light emitting layer is disposed on the second auxiliary electrode layer; and the cathode electrode layer is disposed on the third light emitting layer.

12. The display module according to claim 11, wherein each of the first light emitting layer, the second light emitting layer, and the third light emitting layer is one of a red light emitting layer, a green light emitting layer, and a blue light emitting layer; and the first light emitting layer, the second light emitting layer, and the third light emitting layer emit light of different colors.

13. The display module according to claim 10, wherein the TFT array is electrically connected to the anode electrode layer and the at least one auxiliary electrode layer through different through holes.

14. The display module according to claim 13, the at least one auxiliary electrode layer and the anode electrode layer are electrically connected to different ones of the TFTs.

15. The display module according to claim 14, wherein the display panel comprises the first auxiliary electrode layer, the second auxiliary electrode layer, a first TFT, a second TFT, and a third TFT; the anode electrode layer is electrically connected to the first TFT; the first auxiliary electrode layer is electrically connected to the second TFT; and the second auxiliary electrode layer is electrically connected to the third TFT.

16. The display module according to claim 15, wherein the anode electrode layer is electrically connected to the first TFT through the first through hole; the first auxiliary electrode layer is electrically connected to the second TFT through the second through hole; and the second auxiliary electrode layer is electrically connected to the third TFT through the third through hole.

17. The display module according to claim 10, wherein the light emitting layer comprises a hole transport layer, a light emitting device layer, and an electron transport layer.

18. The display module according to claim 10, wherein the third metal layer passes through the interlayer insulation layer, the second gate insulation layer, and the first gate insulation layer to connect to the active layer through the via hole.

* * * * *